(12) United States Patent
Kim et al.

(10) Patent No.: US 6,906,595 B2
(45) Date of Patent: Jun. 14, 2005

(54) VARIABLE GAIN CURRENT FEEDBACK AMPLIFIER

(75) Inventors: Heung S. Kim, San Jose, CA (US); Lapoe E. Lynn, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 20 days.

(21) Appl. No.: 10/654,520

(22) Filed: Aug. 30, 2003

(65) Prior Publication Data

US 2005/0046483 A1 Mar. 3, 2005

(51) Int. Cl.$^7$ ................................................. H03F 3/04
(52) U.S. Cl. ...................... 330/311; 330/282; 330/291
(58) Field of Search ................................ 330/311, 278, 330/282, 291, 86

(56) References Cited

U.S. PATENT DOCUMENTS

| | | | | |
|---|---|---|---|---|
| 4,354,163 A | * | 10/1982 | Kato | 330/293 |
| 4,396,890 A | * | 8/1983 | Kato et al. | 330/86 |
| 4,595,884 A | * | 6/1986 | Miller, Jr. | 330/258 |
| 5,430,765 A | * | 7/1995 | Nagahori | 375/318 |
| 5,661,437 A | | 8/1997 | Nishikawa et al. | 330/282 |
| 6,052,030 A | * | 4/2000 | Garner et al. | 330/282 |
| 6,211,737 B1 | | 4/2001 | Fong | 330/282 |

OTHER PUBLICATIONS

Robert G. Meyer et al., "A Wideband Low–Noise Variable–Gain BiCMOS Transimpedance Amplifier", IEEE Journal of Solid–State Circuits, vol. 29, No. 6, Jun. 1994, pp. 701–706.

* cited by examiner

*Primary Examiner*—Patricia Nguyen
(74) *Attorney, Agent, or Firm*—Christopher P. Maiorana, PC

(57) ABSTRACT

An apparatus comprising an amplifier, a first resistor and a second resistor. The amplifier (i) comprises a first transistor and a second transistor and (ii) may be configured to generate an output signal in response to an input signal. The first resistor may be connected between an emitter of the second transistor and a signal ground. The second resistor may be connected between the emitter of the second transistor and a base of the first transistor. A gain of the amplifier may be adjusted by varying a value of the first resistor and a value of the second resistor.

17 Claims, 4 Drawing Sheets

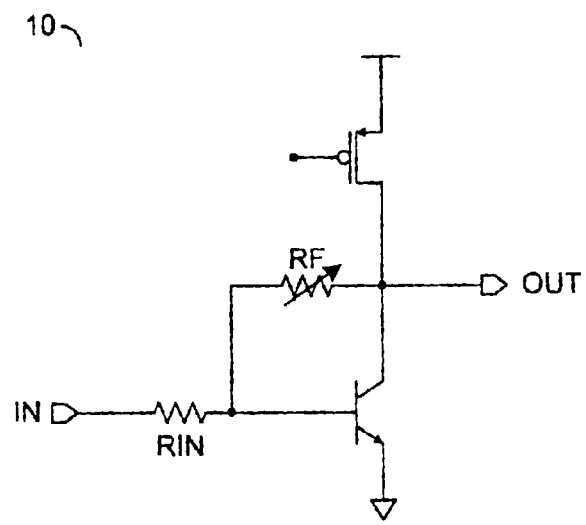
(CONVENTIONAL)
FIG. 1
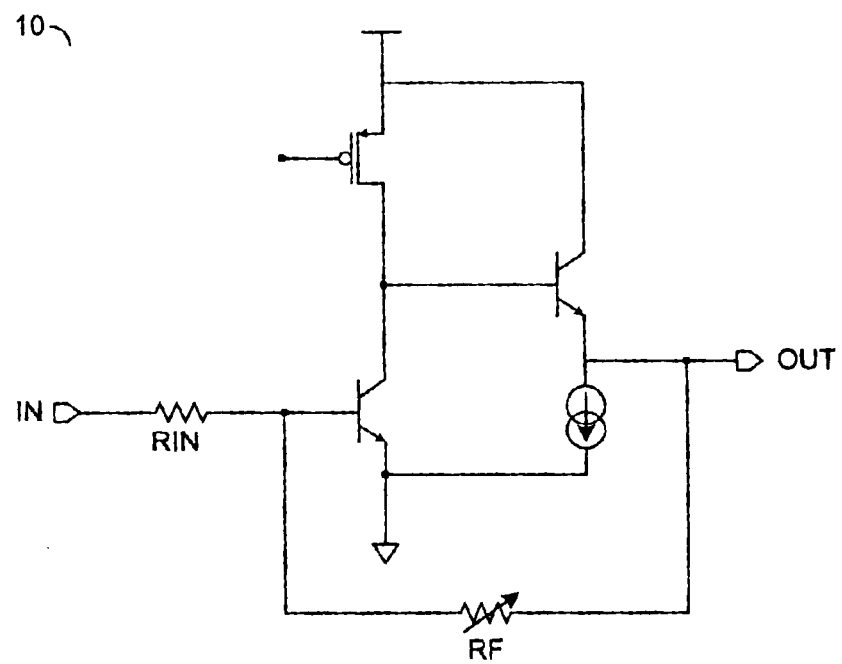
(CONVENTIONAL)
FIG. 2

VARIABLE GAIN CURRENT FEEDBACK AMPLIFIER

FIELD OF THE INVENTION

The present invention relates to amplifiers generally and, more particularly, to a high performance variable gain current feedback amplifier.

BACKGROUND OF THE INVENTION

Conventional broadband and wireless communication receivers use a high performance front end amplifier, often called a low noise amplifier (LNA). Such amplifiers should have excellent noise performance and linearity performance across both a wide frequency bandwidth and a wide range of input signal power.

Building a front end variable gain amplifier (VGA) that can simultaneously maintain good noise, good linearity, and wide bandwidth is a very challenging task. When the input signal power can be either very small or very large, accomplishing this task with a fixed-gain amplifier becomes next to impossible. Large gains applied to large signals tend to lead to high distortion levels. Small gains and small signal levels tend to lead to poor signal-to-noise ratios (SNRs).

A front end amplifier can manage the noise-linearity tradeoff by varying its gain depending on input signal strength. If an input signal is weak, a LNA needs higher gain and low noise performance. If an input signal is strong, a LNA needs a reduced gain correspondingly to deliver an optimum signal amplitude to the next stage while maintaining good linearity performance to handle a relatively large signal. If the gain must be changed across an order of magnitude or more, it is difficult to implement a linear gain control function in a broadband LNA while maintaining both noise and a linearity performance requirements.

Referring to FIGS. 1 and 2, a circuit 10 is shown illustrating a conventional amplifier design. The circuit 10 generates a signal OUT in response to a signal IN. The gain of the amplifier 10 is varied by changing the shunt feedback resistor RF. Such conventional current feedback amplifiers are a common choice for a broadband LNA design because of the wide band performance. However, for a large amount of gain change, it becomes increasingly difficult to maintain good linearity, noise, and bandwidth by changing the gain by only varying the value of a feedback resistor RF.

In particular, if the gain of the amplifier 10 is varied only with the feedback resistor RF (i.e., Gain=RF/RIN), then for higher gain settings a large value (i.e., 3KΩ) of the resistor RF is needed. When the signal IN is amplified by using a large resistor RF, as the gain becomes bigger headroom limitations can cause the signal OUT to become more nonlinear. Furthermore, high values of the feedback resistor RF almost always lead to bandwidth shrinkage (i.e., a smaller frequency range where the desired gain is maintained). In the case of the low gain setting, as the value of the resistor RF is set to a low value (i.e., 100Ω), the noise contribution from the resistor RF is increased which can unacceptably deteriorate SNR at the low gain setting. Furthermore, maintaining stability as the feedback resistor RF is changed by an order of magnitude or more becomes very difficult, and would likely result in small bandwidth.

As a result, a current feedback amplifier that adjusts the gain with only the resistor RF may not meet the strict requirements demanded by modern high-speed variable-gain LNAs.

It would be desirable to implement a variable gain current feedback amplifier that maintains a wide bandwidth and stability.

SUMMARY OF THE INVENTION

An apparatus comprising an amplifier, a first resistor and a second resistor. The amplifier (i) comprises a first transistor and a second transistor and (ii) may be configured to generate an output signal in response to an input signal. The first resistor may be connected between an emitter of the second transistor and a signal ground. The second resistor may be connected between the emitter of the second transistor and a base of the first transistor. A gain of the amplifier may be adjusted by varying a value of the first resistor and a value of the second resistor.

The objects, features and advantages of the present invention include providing an amplifier that may (i) provide a variable gain, (ii) maintain a target gain across a wide frequency range and/or (iii) be implemented in a variety of topologies.

BRIEF DESCRIPTION OF THE DRAWINGS

These and other objects, features and advantages of the present invention will be apparent from the following detailed description and the appended claims and drawings in which:

FIG. 1 is a diagram of a conventional amplifier;

FIG. 2 is a diagram of a conventional amplifier;

DETAILED DESCRIPTION OF THE PREFERRED EMBODIMENTS

Figure 3A:
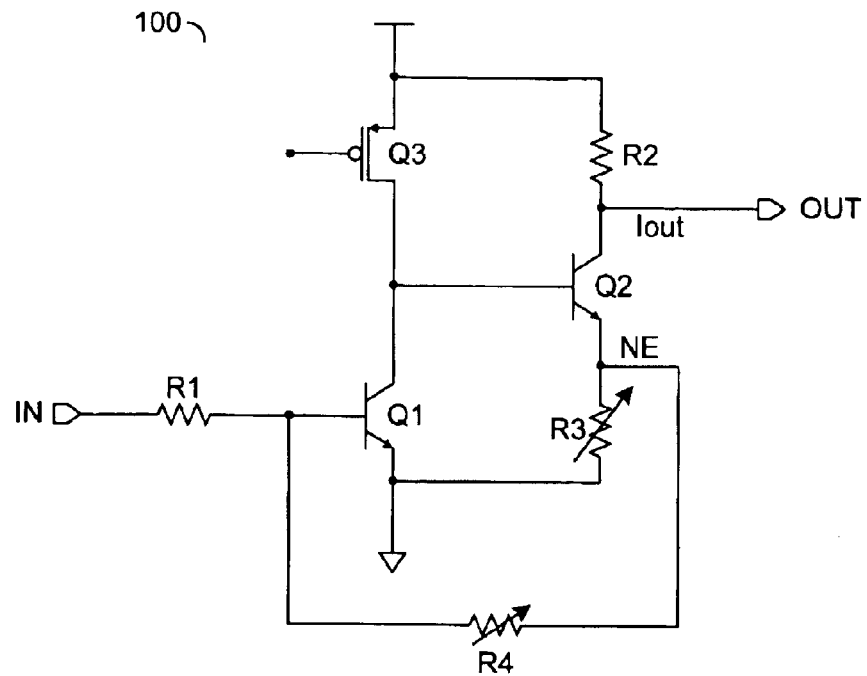
FIG. 3a is a diagram illustrating a preferred embodiment of the present invention.
Figure 3B:
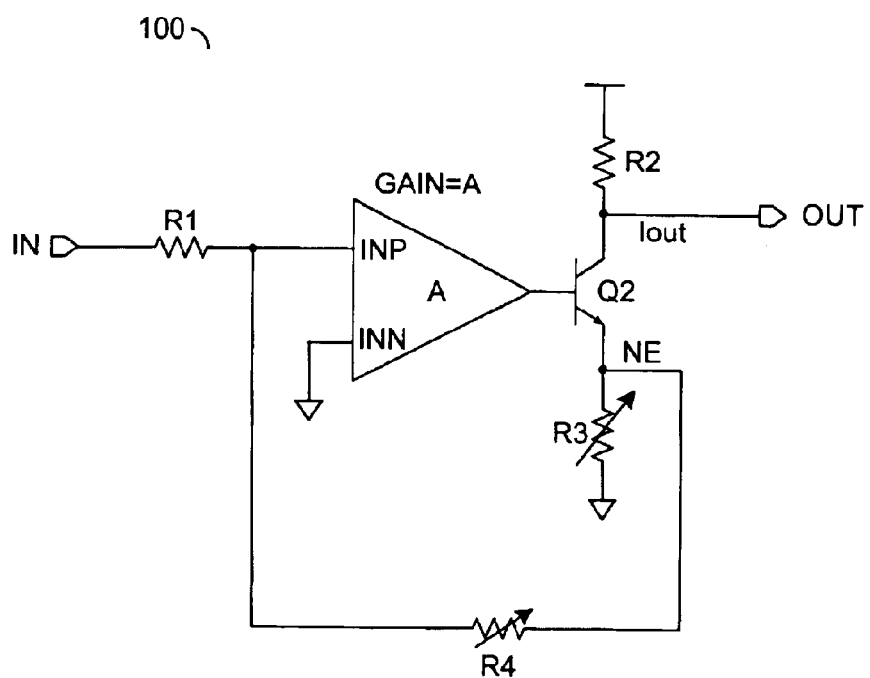
FIG. 3b is a diagram illustrating an alternate implementation of the present invention.

Referring to FIG. 3, a diagram of a circuit 100 is shown in accordance with the present invention. The present invention may be used in the front end of broadband and wireless communication receivers. The circuit 100 generates a signal (e.g., OUT) in response to a signal (e.g., IN). The circuit 100 generally comprises a transistor Q1, a transistor Q2, a transistor Q3, a resistor R1, a resistor R2, a variable resistor R3 and a variable resistor R4. The transistors Q1 and Q2 may be implemented as bipolar transistors. The transistor Q3 may be implemented as a CMOS transistor. The resistor R1 may couple the input signal IN to a base of the transistor Q1. The resistor R2 is generally coupled between a supply voltage (e.g., VCC) and the collector of the transistor Q2. The source of the transistor Q3 is also normally connected to the supply voltage VCC. The resistor R3 is generally connected between the emitter of the transistor Q2 and a signal ground (e.g., VGD). The emitter of the transistor Q1 is also normally connected to the signal ground VGD. The resistor R4 is generally connected between the emitter of the transistor Q2 and a base of the transistor Q1.

The resistors R3 and R4 may be implemented as variable resistors. The variable resistors R3 and R4 may be configured in response to one or more control signals (to be described in connection with FIG. 5). The resistor R4 may be referred to as a feedback resistor. The resistor R3 may be referred to as a degeneration resistor. A collector of the transistor Q2 may present the output signal OUT. The circuit 100 may use two approaches to vary the amplification of the input signal IN. The circuit 100 may vary the resistor R3, the resistor R4 or a combination of the two.

Current from the signal IN is normally forced onto the feedback resistor R4 creating a voltage signal at a node NE (e.g., at the emitter of the transistor Q2). The node NE generally has an amplitude of R4*Iin, where Iin is the current of the input signal IN. The signal on the node NE is then divided by the parallel resistance (R3∥R4) to create an output current Iout. Therefore, the gain (e.g., G) of the amplifier 100 is shown by EQ1, where R4/(R3∥R4) (if the open loop gain is assumed to be large (e.g., a gain of 30–40 dB or more normally reduces the effect of an error factor not contemplated by the equation EQ1)). The gain G may be a current gain, a current to voltage gain or a voltage to voltage gain depending on the particular configuration of the circuit 100. Changing the value of the resistor R3 and/or the value of the resistor R4 will change the gain G of the circuit 100. Changing both the value of the feedback resistor R4 and the value of the degeneration resistor R3 allows the circuit 100 to maintain optimum performance across the entire gain control range.

In the circuit 100, a relatively small value (e.g., in the range of 30Ω–128Ω) for the resistor R4 may be used for larger gain setting. Higher gain range may be implemented by varying the resistor R3 (e.g., between a range of 20Ω and 10KΩ) without compromising stability. On the node NE, the signal amplitude is smaller than in a conventional case, which gives the circuit 100 a better linearity performance at the higher gain when compared with conventional designs.

For a smaller gain setting, the gain of the circuit 100 may be reduced by increasing the value of the resistor R3, which enables the value of the resistor R4 to be optimized for the better noise performance. The smaller the value of the resistor R4, the worse the noise figure performance specification. Varying the resistor R4 normally has a nearly one to one correlation between noise and gain. As the gain increases, the noise decreases. However, the resistor R3 normally has a weaker correlation between gain and noise. The gain may be increased with less of an impact on noise. Therefore, the invention may enable a wide range of gain control while maintaining the condition of the better linearity and noise performance.

Figure 4:
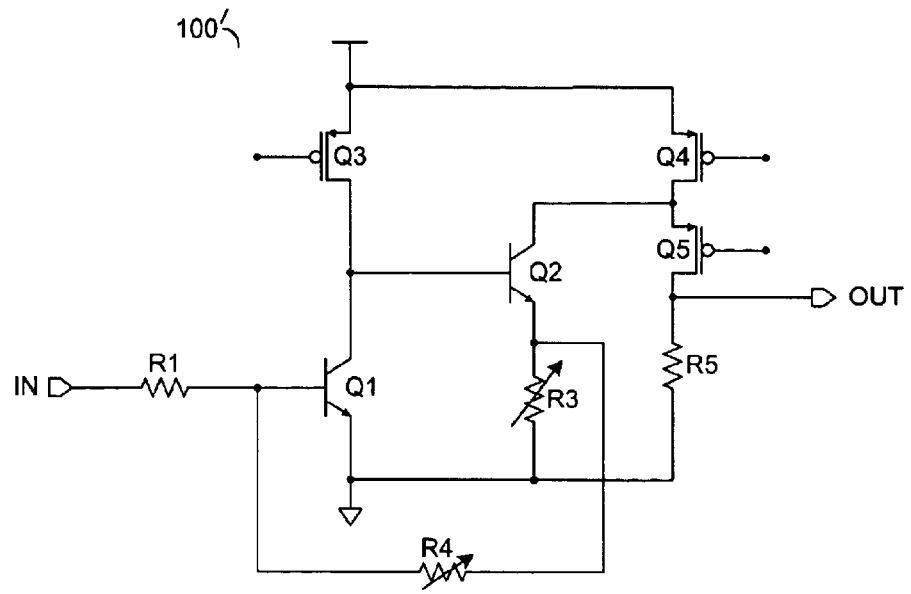
FIG. 4 is a more detailed diagram of the present invention.

Referring to FIG. 4, a circuit 100' where the output node OUT is folded is shown. The circuit 100' replaces the resistor R2 of FIG. 3 with a transistor Q4 and a transistor Q5. The transistors Q4 and Q5 may be implemented as CMOS transistors. A resistor (e.g., R5) is also implemented between the node OUT and the emitter of the transistor Q1 (and a second side of the resistor R3). The resistor R5 may help generate the signal OUT based on the ground to avoid a possible miller capacitance formed by the transistor Q2. Additional gain is provided by the resistor R5/R3.

Figure 5:
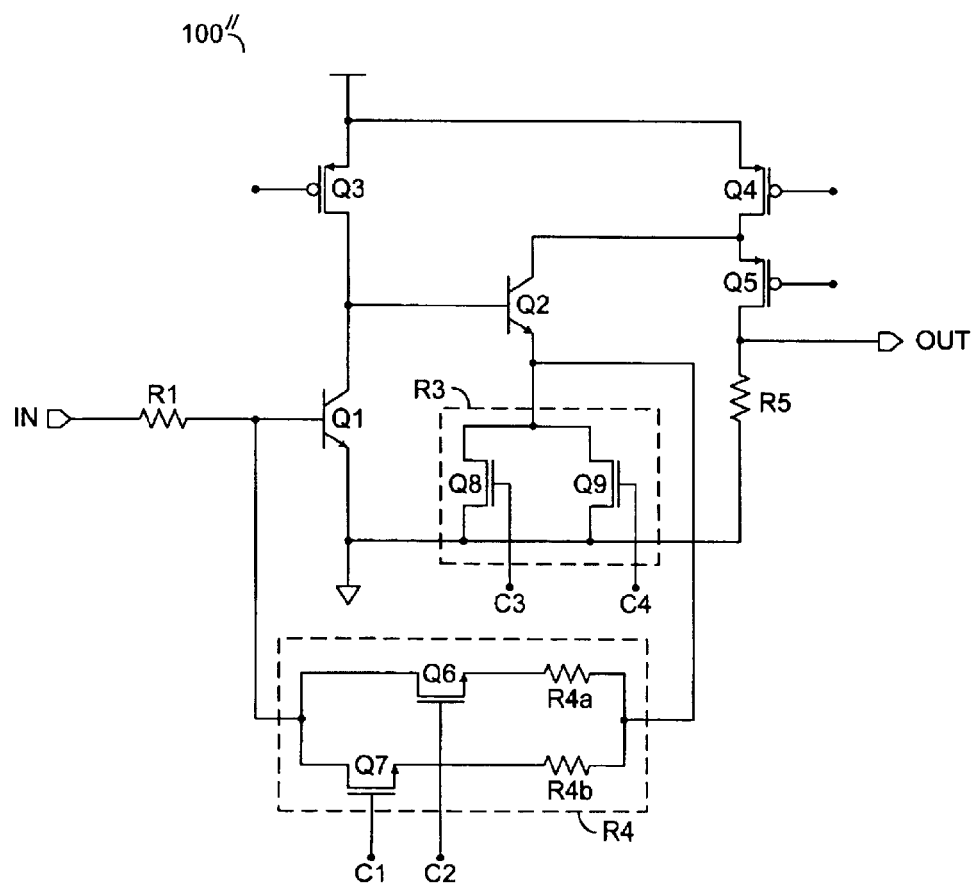
FIG. 5 is a more detailed diagram of the present invention.

Referring to FIG. 5, an example of a circuit 100" is shown illustrating an alternate embodiment of the present invention. The resistor R3 and the resistor R4 are shown implemented using multiple control elements. For example, the resistor R4 is shown implemented as a transistor Q6, a transistor Q7, a resistor R4a and a resistor R4b. The transistors Q6 and Q7 may be implemented as a plurality of transistors. The resistor R4a and the resistor R4b may implement a plurality of resistors. The particular number of transistors Q6 and Q7 and the particular number of resistors R4a and R4b may be varied to meet the design criteria of a particular implementation. For example, 8 transistors and 8 resistors may be implemented in a particular implementation. The transistors Q6 and Q7 may be implemented as digital or analog transistors. With digital transistors, a control signal (e.g., C1) may be used to turn on (or enable) the transistor Q7, which enables the resistor R4b. A control signal (e.g., C2) may be used to turn on (or enable) the transistor Q6, which enables the resistor R4a. With digital transistors Q6 and Q7, the control signals C1 and C2 may be digital signals. With analog transistors Q6 and Q7, a continuously variable resistance may be obtained by varying the controls C1 and C2 (where the control signals C1 and C2 are analog signals).

The resistor R3 is shown implemented as a transistor Q8 and a transistor Q9. The transistors Q8 and Q9 may be either digital or analog transistors. The particular number of transistors Q8 and Q9 may be varied to meet the design criteria of a particular implementation. For example, 14 transistors may be implemented in a particular implementation. With digital transistors, a control signal (e.g., C3) may be used to turn on (or enable) the transistor Q8. A control signal (e.g., C4) may be used to turn on (or enable) the transistor Q9. With analog transistors, the transistors Q8 and Q9 may provide a continuously variable resistance that generally responds to different levels of the control signals C3 and C4. With analog transistors, the control signals C3 and C4 may be analog signals. With digital transistors, the signals C3 and C4 may be digital signals. The control signals C3 and C4 may be implemented as a multi-bit control signal or as discrete control signals. The plural elements in the places of the resistor R3 and the resistor R4 may achieve optimized performances in noise and linearity.

Figure 6:
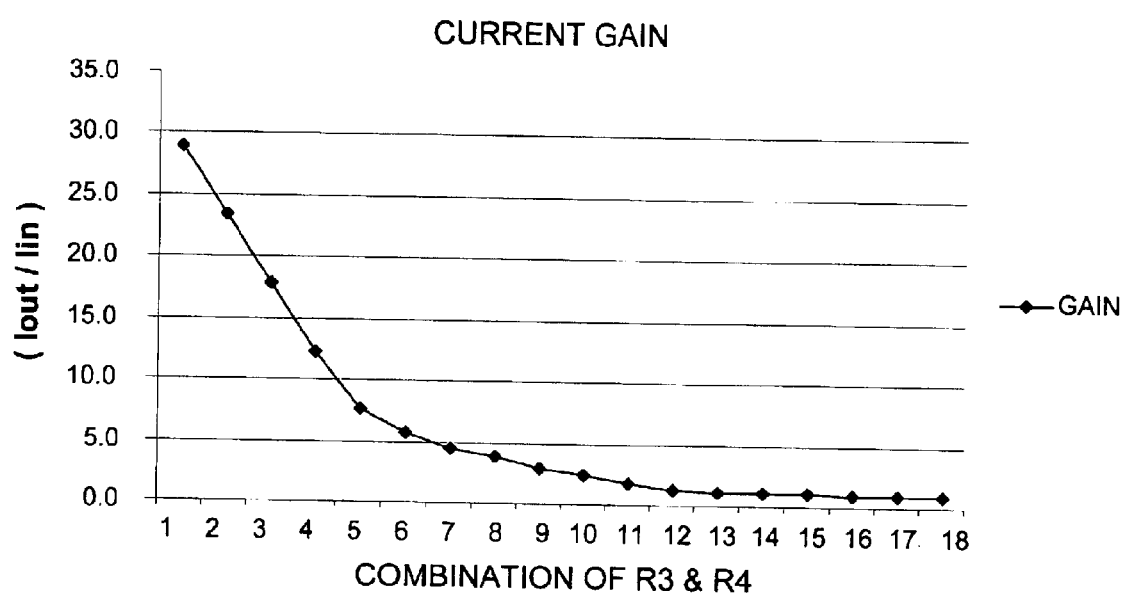
FIG. 6 is a diagram illustrating a gain curve when implementing various combinations of resistance values.

Referring to FIG. 6, a plot illustrating the gain generated with various resistance values for the resistors R3 and R4. The following TABLE 1 illustrates the values simulated to generate the plot shown in FIG. 6:

TABLE 1

|  | R3 (ohm) | R4 (ohm) | G = Iout/Iin = R4/(R3 // R4) = (R3 + R4)/R3 |
|---|---|---|---|
| 1 | 5 | 140 | 29.000 |
| 2 | 5 | 112 | 23.400 |
| 3 | 5 | 84 | 17.800 |
| 4 | 5 | 56 | 12.200 |
| 5 | 5 | 32.9 | 7.580 |
| 6 | 6 | 28 | 5.667 |
| 7 | 8 | 28 | 4.500 |
| 8 | 10 | 28 | 3.800 |
| 9 | 15 | 28 | 2.867 |
| 10 | 20 | 28 | 2.400 |
| 11 | 40 | 28 | 1.700 |
| 12 | 80 | 28 | 1.350 |
| 13 | 160 | 28 | 1.175 |
| 15 | 320 | 28 | 1.088 |
| 15 | 640 | 28 | 1.044 |
| 16 | 1,280 | 28 | 1.022 |
| 17 | 2,560 | 28 | 1.011 |
| 18 | 10,240 | 28 | 1.003 |

While the circuit 100, 100' and 100" are shown as single ended implementations, modifications may be made to meet the design criteria of a particular implementation. For example, the circuit 100, the circuit 100' and/or the circuit 100" may be implemented as differential circuitry.

While the transistors Q1 and Q2 have been described as bipolar transistors, the particular type of transistor may be varied to meet the design criteria of a particular implementation. For example, the transistors Q1 and Q2 may be implemented as high gain transistors such as heterojunction bipolar transistors, NPN Bipolar transistors, MOSFET transistors, etc. Similarly, the transistors Q3, Q4 and Q5 have been described as CMOS transistors. However, other high gain transistor types, such as bi-CMOS, MOSFET, etc. may be used to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an amplifier (i) comprising a first transistor and a second transistor and (ii) configured to generate an output signal on an output node in response to an input signal, wherein said amplifier comprises a differential amplifier;
   a first resistor connected between an emitter of said second transistor and a signal ground; and
   a second resistor connected between said emitter of said second transistor and a base of said first transistor, wherein a gain of said amplifier is adjusted by varying a value of said first resistor and a value of said second resistor.

2. The apparatus according to claim 1, wherein said apparatus further comprises (i) a third transistor connected between a supply voltage and a collector of said first transistor and (ii) a third resistor connected between said supply voltage and a collector of said second transistor.

3. The apparatus according to claim 1, wherein said apparatus further comprises an input resistor connected between said base of said first transistor and said input signal.

4. The apparatus according to claim 2, wherein said third resistor is implemented as a fourth transistor and a fifth transistor.

5. The apparatus according to claim 4, wherein said apparatus further comprises a fifth resistor connected between said output node and said signal ground.

6. The apparatus according to claim 1, wherein said first resistor comprises a plurality of transistors.

7. The apparatus according to claim 6, wherein said second resistor comprises a plurality of transistors.

8. The apparatus according to claim 7, wherein said plurality of transistors enables a resistor pair in response to a first and second control signal.

9. The apparatus according to claim 8, wherein said first control signal enables a first resistor of said resistor pair and said second control enables a second resistor of said resistor pair.

10. An apparatus comprising:
    an amplifier (i) comprising a transistor and a gain stage and (ii) configured to generate an output signal on an output node in response to an input signal;
    a first resistor comprising a plurality of transistors connected between an emitter of said transistor and a signal ground; and
    a second resistor connected between said emitter of said transistor and an input of said gain stage, wherein a gain of said amplifier is adjusted by varying a value of said first resistor and a value of said second resistor.

11. The apparatus according to claim 1, wherein:
    said first resistor comprises a first continuously variable resistive element adjustable in response to a first analog control signal; and
    said second resistor comprises a second continuously variable resistive element adjustable in response to a second analog control signal.

12. The apparatus according to claim 1, wherein:
    said first resistor comprises a first plurality of digital resistive elements, when one or more of said digital resistive elements are enabled in response to a first digital control signal; and
    said second resistor comprises a second plurality of digital resistive elements, when one or more of said digital resistive elements are enabled in response to a second digital control signal.

13. The apparatus according to claim 12, wherein said first digital and control signals comprise a multi-bit control signals.

14. The apparatus according to claim 10, wherein said amplifier comprises a differential amplifier.

15. A method for controlling an amplifier comprising the steps of:
    (A) implementing an amplifier (i) comprising a first transistor and a second transistor and (ii) configured to generate an output signal in response to an input signal;
    (B) implementing a first resistor connected between an emitter of said second transistor and a signal ground; and
    (C) implementing a second resistor connected between said emitter of said second transistor and a base of said first transistor, wherein a gain of said amplifier is adjusted by varying a value of said first resistor and a value of said second resistor controlled by (i) one or more multi-bit digital control signals and (ii) one or more multi-bit analog control signals.

16. The method according to claim 15, wherein:
    said first resistor comprises a first continuously variable resistive element adjustable in response to a first of said analog control signals; and
    said second resistor comprises a second continuously variable resistive element adjustable in response to a second of said analog control signals.

17. The method according to claim 15, wherein:
    said first resistor comprises a first plurality of digital resistive elements, when one or more of said digital resistive elements are enabled in response to a first of said digital control signals; and
    said second resistor comprises a second plurality of digital resistive elements, when one or more of said digital resistive elements are enabled in response to a second of said digital control signals.

* * * * *